United States Patent Office 3,288,608
Patented Nov. 29, 1966

3,288,608

LIGHT-SENSITIVE COATING FOR PRE-SENSITIZED PLATES INTENDED FOR OFFSET PRINTING AND FOR ENGRAVED WIRING OF PRINTED CIRCUITS

Germain Yves Coutaud, Paris, Louis Armand Facquet, Vaucresson, Leon Rene Lehmann, Paris, and Harry Andre Joseph Schuh, Vimoutiers, France, assignors to Nobel-Bozel, Paris, France, a joint-stock company of France No Drawing. Filed Dec. 9, 1963, Ser. No. 329,276
Claims priority, application France, Dec. 14, 1962, 918,720
17 Claims. (Cl. 96—33)

It is already known to provide light-sensitive coatings for pre-sensitized plates intended for offset printing. However, the plates obtained by prior practices have generally one or more of the following disadvantages: a limited period of conservation; a fairly low strength which results in rapid wear or deterioration during use; and a low speed of reproduction operations.

The method according to the present invention not only permits all these disadvantages to be overcome, but it provides a photo-sensitive coating which can be used both for offset printing and for flat engraved wiring for printed circuits, inductances, various windings, etc., which represents a remarkable innovation.

In order to facilitate understanding of the description which follows, the known principles of the preparation and use of a pre-sensitized plate—copy printing as a positive—will first of all be briefly recalled.

A metallic surface, which may be a supporting plate or a sheet of metal stuck on a supporting plate, is covered with a so-called "sensitive" coating, the constituents of this coating having the property of being decomposed by the action of ultra-violet rays.

In the case of offset printing, a metal supporting plate is employed, for example aluminum, while for the formation of printed circuits there is utilized a sheet of metal, such as copper, stuck on a supporting plate, for example stratified paper.

The document to be reproduced on the metal surface is itself on a transparent support (film), the parts to be reproduced (text, drawings, etc.) being opaque and preventing the passage of light. The document is applied against the sensitive surface of the plate. The design to be reproduced by also represent wiring for a printed circuit to be carried out by engraving.

The exposure is then made, after which the design to be reproduced is removed.

The plate is then developed with an appropriate liquid (developer), the main object of this operation being to eliminate the decomposition products formed by the action of actinic energy on the light sensitive coating and thus to leave the metal bare at the places where the sensitive coating has been exposed to light.

The unexposed portions of the coating should then be strongly adherent.

In the case of pre-sensitized plates for offset printing, the unexposed portions become the printing portions; they must therefore be capable of accepting inks.

In the case of engraved wiring for printed circuits, the plate is treated with a copper solvent, to which the unexposed coating must be immune. However, such coating must be capable of being subsequently dissolved in an appropriate solvent so that after the exposed copper has been removed, the coating may then be removed to lay bare the copper which is located underneath and which will constitute the engraved wiring system.

The requirements with regard to the properties of the light-sensitive coating are thus very different in the case of offset printing and in that of producing engraved wiring systems, which explains why different methods of preparation have been generally employed in these two cases up to the present time.

The method of preparation of the light-sensitive coating of the present invention consists of the following features:

Dissolving in an alcoholic medium, anhydrides of the diazonaphthol-sulphonic acids, such as the anhydride of 1-diazo 2-naphthol 4-sulphonic acid.

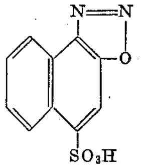

(I)

Preferably dissolving in the alcoholic mixture at least one of its isomers, such as the anhydride of 2-diazo 1-naphthol 5-sulphonic acid.

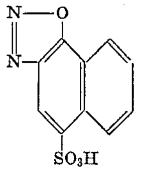

(II)

Dissolving in the alcoholic medium a para-diazo-diphenylamine, such as para-diazo-diphenylamine sulphate.

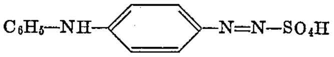

(III)

In the alcoholic mixture compound (III) will react with part of compound (I) and/or with its isomer compound (II).

Dissolving in the above alcoholic medium a phenol resin with a low molecular weight, preferably of the novolak type represented by the simplified formula:

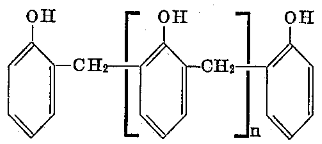

or, in order to simplify still further:

$$HO—C_6H_4—CH_2— . . . \qquad (IV)$$

so as to obtain an alcohol varnish containing reactive constituents and capable of being used for coatings.

Finally, coating a metallic surface with the said alcohol varnish and then heat treating, so as to poly-condense the said phenol resin slightly and to cause it to react chemically with the unreacted anhydride or anhydrides of diazonaphthol-sulphonic acids (I, II), which still exist in the free state in the medium.

According to a preferred embodiment of the invention, there are dissolved in alcohol, in stoichiometric quantities, molecule for molecule, the anhydride of 1-diazo 2-naphthol 4-sulphonic acid (I) and the sulphate of para-diazo-diphenylamine (III) at ordinary temperature while stirring, so as to form in the alcoholic solution a compound (V) in accordance with a reaction of the kind:

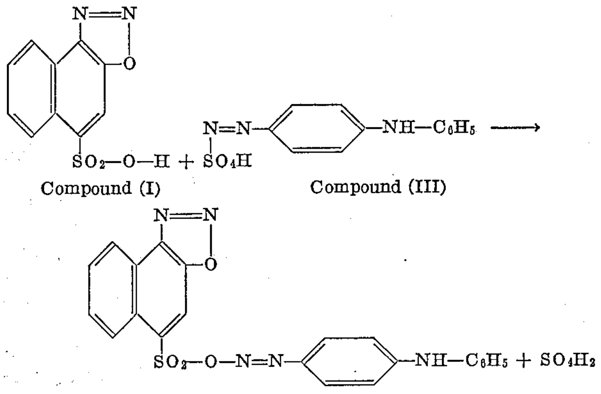

Compound (I) Compound (III)

Compound (V)

The compound (V) formed is not very soluble and may precipitate partially, in which case the precipitate portion is separated by filtration.

There is furthermore dissolved in the above alcoholic medium, either before or after the formation of the compound (V), the anhydride of 2-diazo 1-naphthol 5-sulphonic acid (compound (II)) preferably in a proportion of 2 molecules per molecule of the compound (I), and the phenol resin of low molecular weight compound (IV), preferably employed in a proportion which would correspond, based on the average molecular weight of the resin, to about 3 to 6 molecules of the phenol resin per molecule of the compound (II).

The alcohol varnish thus obtained is applied to the metallic surface of the plate for offset printing or for printed circuits, then it is subjected to a heat treatment in order to obtain, at the same time as the evaporation of the alcohol, a slight poly-condensation of the compound (IV) to the product (IV′), together with the formation of a compound (VI), following a reaction such as the following:

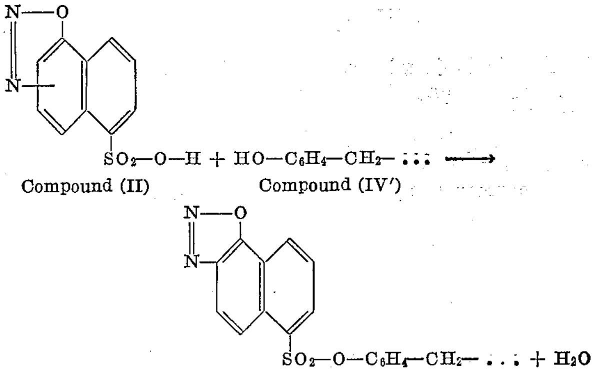

Compound (II) Compound (IV′)

Compound (VI)

This compound (VI) has a physical interaction on the compound (V) previously formed, so that there is finally obtained a pre-sensitized coating which is sufficiently insoluble in dilute alkalis, has an excellent inkability, a high mechanical strength, generally keeps for years, and which can be used for both offset printing and producing printed circuits. The compound (VI) prepared separately or the compound (V) prepared separately do not have at all these remarkable properties; separately, they are generally unusable as pre-sensitized coatings, except for offset printing and then they do not have all the desirable properties.

In order to use the pre-sensitized plate thus obtained, it is first exposed under a positive printing block. Under the action of light, the compound (V) and the compound (VI) decompose into products which are soluble in the alkaline solutions, following reactions of the type:

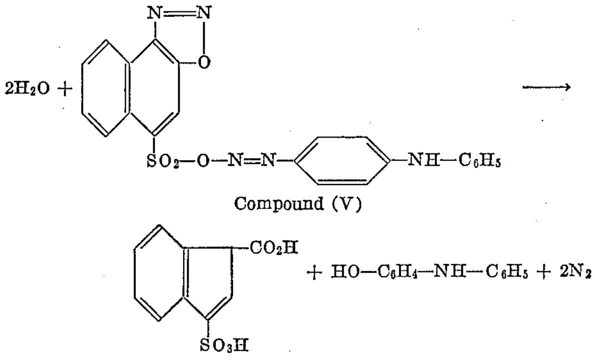

Compound (V)

Compound (VII) Compound (VIII)

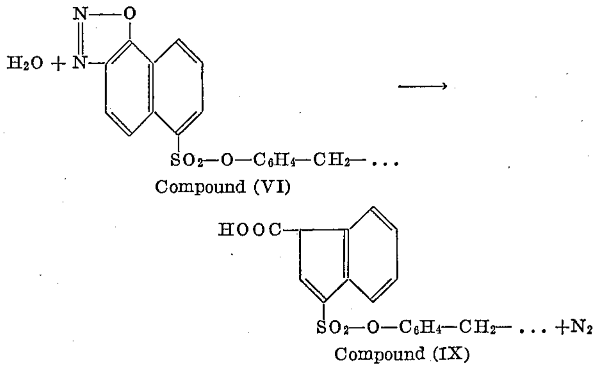

Compound (VI)

Compound (IX)

The products formed (such as compounds VII, VIII and IX) are eliminated by washing the plate (development) with a dilute solution of an alkali, such as trisodium phosphate, in order to bare the underlying metal in the parts which have been exposed.

The unexposed part of the coating is only slightly soluble in the developer and remains highly adherent to the metallic surface; it combines all the properties necessary to serve for offset printing and for the preparation of engraved wiring systems.

For offset printing, the plate obtained (offset transfer) is fixed on the "plate-carrier" cylinder of the printing machine and, by means of a set of rollers, the operations are effected which constitute offset printing which is known in itself, for example:

(1) Wetting of the surface of the plate so as to prevent the taking-up of ink on the metal in the non-printing portions, during the subsequent operation;

(2) Inking operation, the ink being applied only onto the printing portions;

(3) Transfer of the ink on a cloth covered with rubber ("blanket"), stretched over the "blanket-carrier" cylinder;

(4) Transfer of the ink on the paper to be printed, which passes between the "blanket" and a pressure cylinder.

With the light-sensitive coating of the present invention, all these operations can be carried out with great ease; a very high number of transfers can be carried out without the plate being worn or damaged; finally, these reproduction operations can be effected with very great speed, a factor which by itself would already represent considerable technical progress.

For the preparation of an engraved wiring system, the developed plate—on which the copper has been bared at the places exposed to light—is first treated by a copper solvent such as a solution of ferric chloride or nitric acid so as to dissolve this copper away from the non-conducting support to cause to appear at these places such non-conducting support surface (stratified paper), without there being any attack on the unexposed parts of the coating which protect the copper representing the wiring circuit to be effected by engraving.

The non-exposed coating which covers the unattacked copper is then dissolved in an appropriate solvent such as alcohol, so as to make the copper bare; there is thus obtained the desired engraved wiring system.

In spite of the great diversity of the necessary characteristics, the light-sensitive coating of the invention enables all these operations to be carried out with ease and with a remarkable clearness of the reproductions.

This new light-sensitive coating is thus only slightly soluble in dilute alkaline solutions, but is soluble in the same alkaline solutions after its exposure to light; it is very adherent to metallic surfaces, has a high mechanical strength and perfect inkability; it is wholly insoluble in the copper solvents referred to, but is soluble in appropriate organic solvents. All these conditions are combined together to an extremely precise degree, which is essential in order to carry out such delicate operations as offset printing and the preparation of engraved wiring systems.

The anhydride of 1-diazo 2-naphthol 4-sulphonic acid to be employed for carrying out the method according to the invention may be used either in the pure state or in the state of an impure technical product; this latter may contain as impurities graining salts, such as sodium chloride, sodium sulphate; it may also contain a certain proportion of acid in the neutralized state.

The compounds (II) (isomer of the above) and (III) (para-diazo-diphenylamine) to be utilized may also be in the pure state or in the state of technical products, the impurities present in the latter case being the same in principle as for the anhydride of 1-diazo 2-naphthol 4-sulphonic acid.

The phenol resin (IV) to be utilized will preferably be of the novolak type comprising molecules having a molecular weight varying between 200 and 1300, the mean molecular weight being preferably comprised between 600 and 700.

The alcohol to be employed for dissolving the compounds (I), (II), (III) and (IV) of the invention will be for example ethyl or methyl alcohol, preferably ethyl alcohol.

The water content of this alcohol must be comprised between certain limits. If ethyl alcohol is used, it will be selected to have a Gay-Lussac degree comprised between 80 and 98.

The respective proportions of the compounds (I), (II), (III) and (IV) to be dissolved in the said alcohol may vary between wide limits, and one or the other of the constituents may in certain cases be present in excess; however, the molar proportions indicated above will preferably be chosen.

The content of dry material of the alcoholic solution will be comprised for example between 30 and 300 grams per liter, and preferably between 100 and 200 grams per liter.

For dissolving the anhydrides of diazo-naphthol-sulphonic acids (I) and (II) in alcohol, the operation is carried out with agitation and protected from light having too high an actinic value.

The compounds (I) and (II) can be dissolved together or in succession, for example first the compound (I) and then the compound (II), or alternatively first the compound (II) and then the compound (I). After dissolving, the undissolved residues are separated by filtration when so required.

In the alcoholic solution of the compounds (I) and (II), there is then dissolved in the same way the compound (III) para-diazo-diphenylamine; it is advantageous then to leave the solution at rest, protected from light for a period of several tens of hours, for example 24 hours, during which period the reaction between the compound (III) and the corresponding stoichiometric portion of anhydride of diazo-naphthol-sulphonic acid is completed.

In the reaction medium obtained, the resin (IV) is then dissolved, under the same conditions but fairly slowly by fractions.

The alcohol varnish obtained is ready for use.

The duration and the intensity of the thermal treatment after application of the alcohol varnish on the metallic surface must be maintained between well-defined limits. In fact, the thermal treatment must induce the chemical and physical actions mentioned above; however, too intense heating results in a too great degree of poly-condensation of the resin and/or in harmful chemical decompositions. The preferred limits for the temperature and the duration are 80 to 95° C. and 2 to 20 minutes.

After the thermal treatment, a ripening period of at least 20 hours in the cold state is preferred.

For development after the exposure to light, there is employed a dilute aqueous solution of an alkali metal, such as tri-sodium or tri-potassium phosphate, sodium borate, lime water, baryta water or strontia water; more particularly, there will be employed, for example, an aqueous solution of tri-sodium phosphate having a concentration in crystallized product of 0.2% to 10%.

Without departing from the scope of the invention, it is also possible to use instead of alcohol for dissolving the compounds (I), (II), (III), and (IV) any other appropriate organic solvent.

In order to make the invention more readily understood, some examples of various forms of the present invention will be given below, by way of indication but not in any limiting sense.

*Example 1*

In 9 liters of ethyl alcohol at 90° Gay-Lussac, there are dissolved, under agitation and protected from any actinic light, 150 grams of anhydride of 2-diazo 1-naphthol 5-sulphonic acid of a technical solution, having a content of 80% of active product. After about 20 minutes stirring, the undissolved remainder is separated out by filtration, if necessary.

In the alcoholic solution obtained, there are dissolved successively, in the same manner as for the above compound:

75 grams of anhydride of 1-diazo 2-naphthol 4-sulphonic technical acid, having a content of 80% of active product, and 70 grams of sulphate of technical para-diazo-diphenylamine, having a content of 95% of active product.

The mixture is then left to rest for a period of 24 hours or more.

In the reaction medium obtained, there are dissolved while stirring, protected from light to strongly actinic, 875 grams of phenol resin of the novolak type having an average molecular weight of 640, neutral and exempt from free phenol; melting range 75 to 115° C.; viscosity 1:1 in ethyl alcohol=125 cp.

The resin is introduced into solvent medium by small fractions, the complete solution should not be obtained in less than one hour.

The volume is then adjusted to 10 liters with ethyl alcohol at 90° Gay-Lussac, while stirring in order to make the solution homogeneous.

The alcohol varnish obtained is ready for use. It may be stored in a hermetically-closed receptacle protected from light. It is filtered before use.

There will now be described by way of example, the preparation with this alcohol varnish of a pre-sensitized offset plate for office machines.

The alcohol varnish is spread uniformly over the previously brushed and oxidized face of a sheet of aluminium of 99.4% purity and a thickness of 15/100 mm.

The coated plate is subjected to a baking operation at a temperature between 85 and 90° C. for a period of several minutes—about 5 minutes; the plate is then stored for 24 hours or more before use. This pre-sensitized plate can be kept without deterioration for many months and even for years.

For the use of the said pre-sensitized plate, its exposure is first effected under a positive film applied strongly against its sensitive face; the exposure will be made by means of an apparatus producing an intense ultra-violet radiation.

The exposed plate is developed by means of an aqueous solution of tri-sodium phosphate of about 4%, for example.

The plate obtained, which is an "offset transfer," is mounted on a machine and the operations are carried out which together constitute the offset printing, these operations being well known per se, following the main principles referred to previously.

*Example 2*

An alcohol varnish is prepared exactly as in Example 1 but employing 1500 grams of phenol resin instead of 875 grams.

The alcohol varnish is uniformly spread on a copper face composite, previously cleaned mechanically and chemically, which has been manufactured in the following manner: a sheet of copper having a thickness of 35 microns (or of 70 microns, as the case may be) is stuck on one of the faces of a plate of a stratified dielectric substance (paper, glass fibre, plastic material, resin, etc.) this special composite material being intended for the manufacture of engraved wiring circuits.

The coated plate is subjected to a baking operation at a temperature comprised between 85 and 90° C. for a period of about 15 minutes; then the plate is left to rest for at least 24 hours before use while protected from light. This pre-sensitized plate can be kept without any deterioration for many months and even for years.

For the use of the said pre-sensitized plate, it is first exposed under a positive printing block which represents the wiring to be effected by engraving.

The exposed plate is developed by means of an aqueous solution of tri-sodium phosphate at about 2%, for example.

The plate obtained is treated with a copper solvent. For example, it is placed in an engraving machine containing an aqueous solution of ferric chloride at 36° Baumé and at ambient temperature. This operation has the object of dissolving the copper in the portions not protected by the coating, and it is stopped as soon as all the copper visible has been dissolved.

Finally, the unexposed coating which covers the unattacked copper is dissolved in ethyl alcohol, in order to bare the copper. Thus, the engraved wiring circuit is completed.

Without departing from the scope of the present invention, it is also possible to utilize the light-sensitive coating of the invention for the preparation of descriptive labels (marking-off steel sheets of large dimensions) and similar manufactures.

We claim:

1. A light-sensitive composition for pre-sensitized plates intended for offset printing and for engraved wiring for printed circuits, said composition comprising the products of the reaction of an anhydride, of diazo-naphthol-sulphonic acid and of at least one isomer of said anhydride, with a para-diazo-diphenylamine and a novolak resin.

2. A light-sensitive composition for pre-sensitized plates intended for offset printing and for engraved wiring for printed circuits, said composition comprising the products of the reaction of the anhydride of 1-diazo 2-naphthol 4-sulphonic acid and its isomer the anhydride of 2-diazo 1-naphthol 5-sulphonic acid, with a sulphate of para-diazodiphenylamine and a novolak resin having a molecular weight of from 200 to 1300.

3. A method of preparation of a light-sensitive coating for pre-sensitized plates intended for offset printing and for engraved wiring for printed circuits, said method comprising:

(a) dissolving in an alcohol medium, an anhydride of diazo-naphthol-sulphonic acid and at least one isomer of said anhydride;

(b) further dissolving in said alcoholic medium a para-diazo-diphenylamine, whereby there is produced in the cold state a reaction between the para-diazo-diphenylamine and part of said anhydrides of diazo-naphthol-sulphonic acid;

(c) dissolving in said alcoholic medium a novolak resin, whereby there is obtained an alcohol varnish comprising reactive constituents;

(d) coating a metallic surface with said alcohol varnish;

(e) heat treating said varnish coating, whereby there is caused a slight poly-condensation of said novolak resin and the chemical reaction of said phenol resin with the unreacted remainder of said anhydrides of diazo-naphthol-sulphonic acid which are in the free state in said medium.

4. A method as set forth in claim 3, wherein the anhydride of diazo-naphthol-sulphonic acid and its isomer are anhydride of the 1-diazo 2-naphthol 4-sulphonic acid and the anhydride of 2-diazo 1-naphthol 5-sulphonic acid.

5. A method as set forth in claim 3, wherein said para-diazo-diphenylamine is the sulphate of para-diazo-diphenylamine.

6. A method as set forth in claim 3, wherein said novolak resin has a molecular weight comprised between 200 and 1300.

7. A method as set forth in claim 3, wherein the said reactants have a purity between 80 and 100%.

8. A method as set forth in claim 3, wherein said heat treatment is carried out at 80 to 95° C. and for 2 to 20 minutes.

9. A method as set forth in claim 3, wherein said alcohol used for dissolving the reactants is ethyl alcohol having a Gay-Lussac degree comprised between 80 and 98.

10. A method as set forth in claim 3, wherein the respective proportions of the reactants to be dissolved in said alcohol are approximately the molar proportions following: 1 mol of said anhydride of diazo-naphthol-sulphonic acid+2 mols of said isomer of said anhydride+1 mol of said para-diazo-diphenylamine+6 to 12 mols of said novolak resin taking as a basis for said novolak resin the average molecular weight of the resin.

11. A method as set forth in claim 3, wherein the content of dry material in the alcoholic solution, after dissolving all the reactants is between 30 and 300 grams per liter.

12. A method as set forth in claim 3, wherein the alcoholic solutions obtained prior to each addition of material are left to rest before proceeding to the subsequent operations.

13. In a method of preparation of a light-sensitive coating for pre-sensitized plates intended for offset printing and for engraved wiring for printed circuits, said method comprising:

(a) dissolving in an alcoholic medium an anhydride of diazo-naphthol-sulphonic acid and at least one isomer of said anhydride;

(b) dissolving in said alcoholic medium a para-diazo-diphenylamine, whereby there is produced in the cold state a reaction product of the para-diazo-diphenylamine and part of said anhydrides of diazo-naphthol-sulphonic acid;

(c) dissolving in said alcoholic medium a novolak resin whereby there is obtained an alcohol varnish comprising reactive constituents;

(d) coating a metallic surface with said alcohol varnish;

(e) heat treating said varnish coating whereby there is caused a slight poly-condensation of said novolak resin and a chemical reaction of said novolak resin with the remainder of said anhydrides of diazo-naphthol-sulphonic acid which are in the free state in said medium to provide a sensitive surface;

(f) applying against the sensitive surface a positive film of the design to be reproduced;

(g) exposing said surface by ultra-violet rays; and (h) developing the sensitive surface by means of a dilute aqueous solution of tri-sodium phosphate having a concentration in crystallized product of 0.2% to 10%.

14. In a method of preparation of a light-sensitive coating for pre-sensitized plates intended for engraved wiring for printed circuits, said method comprising:

(a) dissolving in an alcoholic medium an anhydride of diazo-naphthol-sulphonic acid and of at least one isomer of said anhydride;

(b) dissolving in said alcoholic medium a para-diazo-diphenylamine whereby there is produced in the cold state a reaction between the para-diazo-diphenylamine and part of said anhydrides of diazo-naphthol-sulphonic acid;

(c) dissolving in said alcoholic medium a novolak resin, whereby there is obtained an alcohol coating varnish comprising reactive constituents;

(d) coating a metallic surfaced plate with said alcohol varnish;

(e) heat treating said varnish coating whereby there is caused a slight poly-condensation of said novolak resin and a chemical reaction with the unreacted components of said anhydrides of diazo-naphthol-sulphonic acid which are in the free state in said medium to provide a sensitive surface;

(f) applying a positive film of the design to be reproduced against the sensitive surface;

(g) exposing said surface to ultra-violet rays;

(h) developing the sensitive surface by means of a dilute aqueous solution of tri-sodium phosphate having a concentration, in crystallized product, of 0.2% to 10%;

(i) treating the plate with a solvent of copper, comprising an aqueous solution of ferric chloride at 36° Baumé;

(j) dissolving in an appropriate solvent, comprising ethyl alcohol, the non-exposed coating which covers the unattacked copper of the plate.

15. A light-sensitive coating composition comprising an alcoholic varnish of a reaction product of an anhydride of diazo-naphthol-sulfonic acid and a para-diazo-diphenylamine, and a reaction product of an anhydride of diazo-naphthol-sulfonic acid and a navolak resin of low molecular weight.

16. A method as set forth in claim 11 wherein the content of dry materials in alcoholic solution is between 100 and 200 grams per liter.

17. A method of preparing light-sensitive coatings comprising:

(a) dissolving an anhydride of diazo-naphthol-sulphonic acid in alcohol;

(b) adding to said alcoholic solution a para-diazo-diphenylamine to produce a reaction product between said diphenylamine and part of said anhydride;

(c) adding to said alcoholic solution a navolak resin of low molecular weight to produce an alcohol varnish;

(d) coating a surface with said alcohol varnish; and (e) heat treating said varnish coating to slightly polycondense said novolak resin and effect reaction of said novolak resin with the unreacted remainder of said anhydride.

No references cited.

NORMAN G. TORCHIN, *Primary Examiner.*

C. BOWERS, *Assistant Examiner.*